US012626029B2

(12) United States Patent
Lu et al.

(10) Patent No.: US 12,626,029 B2
(45) Date of Patent: May 12, 2026

(54) PHYSICS-ENHANCED DATA-DRIVEN METHOD AND DEVICE FOR INTELLIGENT STRUCTURAL DESIGN OF SHEAR WALL BUILDING

(71) Applicant: TSINGHUA UNIVERSITY, Beijing (CN)

(72) Inventors: Xinzheng Lu, Beijing (CN); Wenjie Liao, Beijing (CN); Zhe Zheng, Beijing (CN); Yuan Tian, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 291 days.

(21) Appl. No.: 17/920,263

(22) PCT Filed: Mar. 14, 2022

(86) PCT No.: PCT/CN2022/080626
§ 371 (c)(1),
(2) Date: Oct. 20, 2022

(87) PCT Pub. No.: WO2023/029432
PCT Pub. Date: Mar. 9, 2023

(65) Prior Publication Data
US 2024/0211645 A1 Jun. 27, 2024

(30) Foreign Application Priority Data
Sep. 2, 2021 (CN) .......................... 202111028475.8

(51) Int. Cl.
*G06F 30/13* (2020.01)
(52) U.S. Cl.
CPC .................................... *G06F 30/13* (2020.01)
(58) Field of Classification Search
CPC .......... G06F 30/13; G06F 30/00; G06F 30/27; G06F 2119/14; G06N 3/08; G06N 3/047
See application file for complete search history.

(56) References Cited

U.S. PATENT DOCUMENTS 10,997,325 B2 * 5/2021 Austern ............... G06V 10/235
2021/0165929 A1 6/2021 Ayalon

FOREIGN PATENT DOCUMENTS

CN 109635511 A 4/2019
CN 111666617 A 9/2020
(Continued)

OTHER PUBLICATIONS

Xiong, Chen, Xinzheng Lu, and Xuchuan Lin. "Damage assessment of shear wall components for RC frame-shear wall buildings using story curvature as engineering demand parameter." Engineering Structures 189 (2019): 77-88. (Year: 2019).*
(Continued)

*Primary Examiner* — Chuen-Meei Gan
(74) *Attorney, Agent, or Firm* — Dickinson Wright PLLC

(57) ABSTRACT

The present application provides a physics-enhanced data-driven method and device for intelligent structural design of shear wall building, and the method includes: obtaining an architectural design image and a basic design condition text to be processed; inputting the architectural design image and the basic design condition text into a structural design model, and obtaining a structural design image; the structural design model being obtained by performing a structural design image generation capability training and a physical performance optimization training for a physics-enhanced data-driven generative adversarial network; and vectorizing the structural design image and the architectural design image to obtain a structural design result of shear wall building. The physics-enhanced data-driven method and device for intelligent structural design of shear wall building provided by the present application improve the efficiency and the reliability of structural design.

8 Claims, 7 Drawing Sheets

(56) References Cited

FOREIGN PATENT DOCUMENTS

| CN | 112966760 A | 6/2021 |
|----|----|----|
| CN | 113779675 A | 12/2021 |
| JP | H11117383 A | 4/1999 |
| WO | 2021045317 A1 | 3/2021 |

OTHER PUBLICATIONS

Gui, Jie, et al. "A review on generative adversarial networks: Algorithms, theory, and applications." IEEE transactions on knowledge and data engineering 35.4 (2021): 3313-3332. (Year: 2021).*

Oh, Minho, et al. "Integrated system for BIM-based collaborative design." Automation in construction 58 (2015): 196-206. (Year: 2015).*

Zhang, Richard, Phillip Isola, and Alexei A. Efros. "Colorful image colorization." European conference on computer vision. Cham: Springer International Publishing, 2016. (Year: 2016).*

First Office Action for Chinese Application No. 202111028475.8, dated Jan. 30, 2022, pp. 1-7.

International Search Report and Written Opinion for PCT Application No. PCT/CN2022/080626, dated Jun. 10, 2022, pp. 1-8.

Lu et al., "Intelligent structural design of shear wall residence using physics-enhanced generative adversarial networks," Earthquake Engng Struct Dyn., Feb. 22, 2022, pp. 1-20.

* cited by examiner

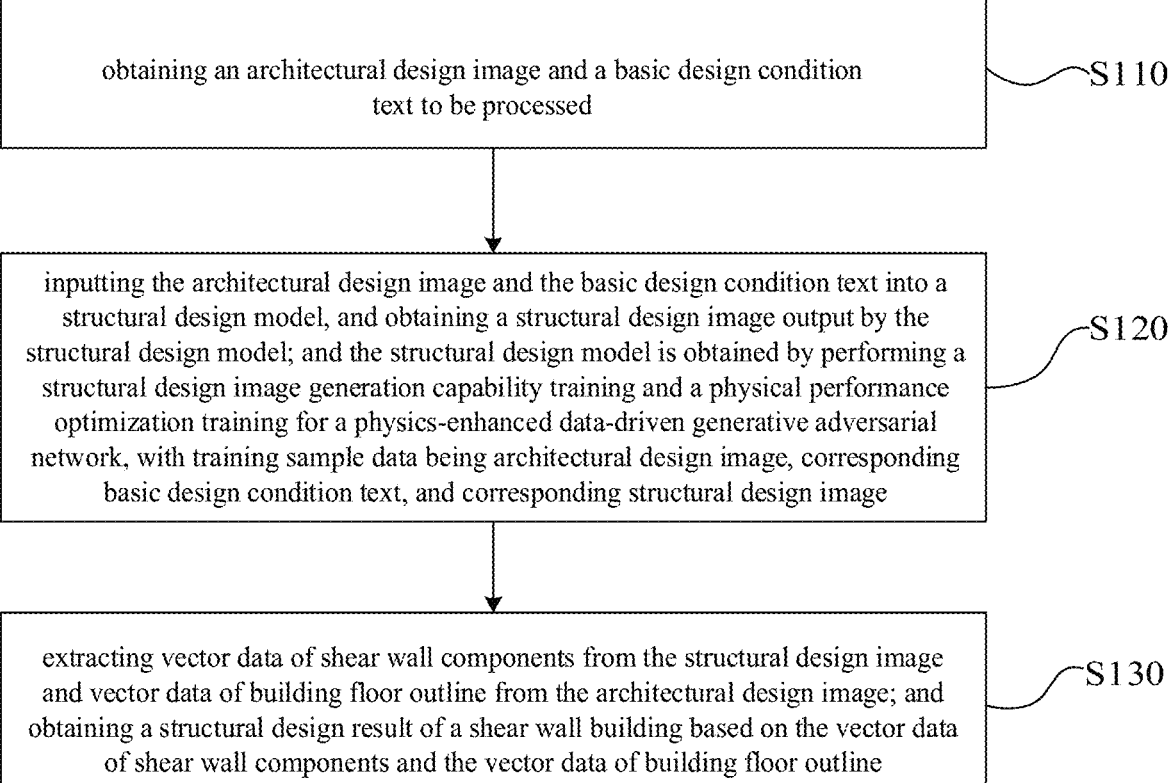

obtaining an architectural design image and a basic design condition
text to be processed  S110 inputting the architectural design image and the basic design condition text into a
structural design model, and obtaining a structural design image output by the
structural design model; and the structural design model is obtained by performing a
structural design image generation capability training and a physical performance
optimization training for a physics-enhanced data-driven generative adversarial
network, with training sample data being architectural design image, corresponding
basic design condition text, and corresponding structural design image  S120 extracting vector data of shear wall components from the structural design image
and vector data of building floor outline from the architectural design image; and
obtaining a structural design result of a shear wall building based on the vector data
of shear wall components and the vector data of building floor outline  S130

FIG. 1

Architectural image    Binarization all elements    Vector data of the floor contour of the standard story    Stiffness center (triangle) and mass center (circle)

Structural image    Binarization shear wall components    Vector data of shear wall components

PHYSICS-ENHANCED DATA-DRIVEN METHOD AND DEVICE FOR INTELLIGENT STRUCTURAL DESIGN OF SHEAR WALL BUILDING

CROSS-REFERENCE TO RELATED APPLICATION

The present application is a national stage application of International Patent Application No. PCT/CN2022/080626 filed on Mar. 14, 2022, entitled "PHYSICS-ENHANCED DATA-DRIVEN METHOD AND DEVICE FOR INTEL-LIGENT STRUCTURAL DESIGN OF SHEAR WALL BUILDING," which claims priority to Chinese patent application, No. 202111028475.8, filed on Sep. 2, 2021, entitled "Physics-Enhanced Data-Driven Method and Device for Intelligent Structural Design of Shear Wall Building", which is hereby incorporated by reference in its entirety.

TECHNICAL FIELD

The present application relates to the technical field of architecture structure design and machine learning, in particular to a physics-enhanced data-driven method and device for intelligent structural design of shear wall building.

BACKGROUND

At present, the structural scheme design of shear wall building is generally completed by experienced engineers. Due to excessive dependence on professional experience, artificial design is difficult to be effectively popularized and applied. In addition, artificial design is time-consuming and labor-intensive, lacks intelligence, and has low efficiency. Hence, intelligent structural design methods emerge as the times require to match the rapid development of intelligent construction.

However, physical mechanisms of structural design are generally described by formula, text, and other complex forms, which are significantly different from the description of image data. And the neural network can only effectively learn the characteristics of image data and can hardly learn the physical mechanisms of structural design directly. As a result, the traditional intelligent structural design methods are only driven by data, and intelligent algorithms cannot learn the physical mechanisms and empirical knowledge of structural design. Furthermore, the final structural design results are challenging to meet the actual physical constraints and requirements of structural design and have a low practical value.

Therefore, there is an urgent need for an intelligent structural design method of shear wall building that can learn physical mechanisms and data raws simultaneously.

SUMMARY

The present application provides a physics-enhanced data-driven method and device for the intelligent structural design of shear wall building, to solve the deficiencies in the related art in which a design method for shear wall building structure cannot learn both physical mechanisms and data raws through intelligent algorithms, resulting in a low practical value of a structure design result.

In a first aspect, a physics-enhanced data-driven method for intelligent structural design of shear wall building provided by the present application, including:

obtaining an architectural design image and a basic design condition text to be processed;

inputting the architectural design image and the basic design condition text into a structural design model, and obtaining a structural design image output by the structural design model; where, the structural design model is obtained by performing a structural design image generation capability training and a physical performance optimization training for a physics-enhanced data-driven generative adversarial network, based on sample data of architectural design image, sample data of basic design condition text corresponding to the sample data of architectural design image and sample data of structural design image corresponding to the sample data of architectural design image; and vectorizing the structural design image and the architectural design image; extracting vector data of shear wall components from the structural design image and vector data of building floor outline from the architectural design image, and subsequently obtaining a structural design result of shear wall building based on the extracted vector data of shear wall components and the vector data of building floor outline.

According to the physics-enhanced data-driven method for intelligent structural design of shear wall building provided by the present application, a training process for the structural design model includes:

building the physics-enhanced data-driven generative adversarial network;

inputting sample data with complete labels into the physics-enhanced data-driven generative adversarial network, and performing the structural design image generation capability training for the physics-enhanced data-driven generative adversarial network; where, the sample data with complete labels includes sample data of architectural design image, sample data of basic design condition text corresponding to the sample data of architectural design image and sample data of structural design image corresponding to the sample data of architectural design image;

performing a calculation of physical performance for the structural design image generated during a process of the structural design image generation capability training, and obtaining a calculation result of physical performance;

building a structural physical performance prediction neural network, and performing a structural physical performance prediction capability training for the structural physical performance prediction neural network: where, training data is composed of the structural design images generated during the process of structural design image generation capability training and the corresponding calculation results of physical performance: subsequently obtaining a structural physical performance prediction model after the training;

calculating image data loss during the process of structural design image generation capability training, calculating corresponding physics loss by the structural physical performance prediction model, fusing the image data loss and the physics loss, to obtain a loss function of the physics-enhanced data-driven generative adversarial network; and performing, based on the loss function, an optimization training for the physics-enhanced data-driven generative adversarial network after the structural design image generation capability training, and obtaining the structural design model.

According to the physics-enhanced data-driven method for intelligent structural design of shear wall building provided by the present application, the physics-enhanced data-driven generative adversarial network includes:

an image generator, which is configured to perform encoding and feature extraction for the sample data of architectural design image and the sample data of basic design condition text, respectively, then fuse the image feature and the text feature and decode a feature fused by the image feature and the text feature, and generate the structural design image: in addition, neural network parameters of the image generator need to receive the guidance of both physical performance loss and image data loss in the optimization training, to make the image generator learn the physical mechanism of structural design and have a structural design image generation capability meets the physical mechanism; and an image discriminator, which is configured to perform feature extraction and authenticity discrimination for the generated structural design image.

According to the physics-enhanced data-driven method for intelligent structural design of shear wall building provided by the present application, the performing the calculation of physical performance for the structural design image generated during the process of the structural design image generation capability training, and obtaining the calculation result of physical performance, includes:

extracting the vector data of shear wall components from the generated structural design image and the vector data of building floor outline from the sample data of architectural design image;

calculating, based on the vector data of shear wall components from the generated structural design image and the vector data of building floor outline from the sample data of architectural design image, floor mass and floor stiffness, creating a mass matrix and a stiffness matrix of the shear wall building, and obtaining a multi-degree-of-freedom mechanics calculation model of the shear wall building; and performing, based on the multi-degree-of-freedom mechanics calculation model, a calculation of structural mechanical response and a performance analysis for the shear wall building, and obtaining the calculation result of physical performance.

According to the physics-enhanced data-driven method for intelligent structural design of shear wall building provided by the present application, a process of building, training, and prediction of the structural physical performance prediction model includes:

establishing a structural physical performance prediction neural network configured for image feature extraction and physical performance prediction, based on a residual network structure;

performing a physical performance prediction capability training for the structural physical performance prediction neural network, with the training data being the structural design image generated during the process of the structural design image generation capability training and the corresponding calculation result of physical performance, and obtaining a structural physical performance prediction model; and performing, by the structural physical performance prediction model, a physical performance prediction for the structural design image generated during the process of the structural design image generation capability training, and then obtaining the corresponding physics loss used for guiding the physics-enhanced data-driven generative adversarial network to perform physical performance optimization training.

According to the physics-enhanced data-driven method for intelligent structural design of shear wall building provided by the present application, after performing, based on the loss function, the optimization training for the physics-enhanced data-driven generative adversarial network after the structural design image generation capability training, the method further includes:

performing a semi-supervised optimization training for the physics-enhanced data-driven generative adversarial network, based on sample data without complete labels and sample data with complete labels; wherein, the sample data without complete labels comprises the sample data of architectural design image and the sample data of basic design condition text.

In a second aspect, a physics-enhanced data-driven device for intelligent structural design of shear wall building provided by the present application, including:

an obtaining module, which is configured to obtain an architectural design image and a basic design condition text to be processed;

a structural designing module, which is configured to input the architectural design image and the basic design condition text into a structural design model, and obtain a structural design image output by the structural design model; where, the structural design model is obtained by performing a structural design image generation capability training and a physical performance optimization training for a physics-enhanced data-driven generative adversarial network, based on sample data of architectural design image, sample data of basic design condition text corresponding to the sample data of architectural design image and sample data of structural design image corresponding to the sample data of architectural design image; and a vector outputting module, which is configured to extract vector data of shear wall components from the structural design image and vector data of building floor outline from the architectural design image, and obtain a structural design result of shear wall building based on the vector data of shear wall components and the vector data of building floor outline.

The physics-enhanced data-driven method and device for intelligent structural design of shear wall building provided by the present application, by performing a structural design image generation capability training and a physical performance optimization training for a physics-enhanced data-driven generative adversarial network, the generated adversarial network can be realized to learn image-text data and physical performance, and the obtained structural design model can generate a structural design image that meets actual design requirements based on the architectural design image and the basic design condition text, thereby improving the efficiency of structural design and the reliability of the final structural design result.

BRIEF DESCRIPTION OF DRAWINGS

In order to more clearly illustrate the technical solutions according to the present application or the related art, the accompanying drawings required to be used in the description of the embodiments or the related art will be briefly introduced as follows. It should be noted that the drawings in the following description are part of embodiments of the present application. For those skilled in the art, other drawings can be obtained based on these drawings without creative efforts.

FIG. 1 is a flow diagram of a physics-enhanced data-driven method for intelligent structural design of shear wall building provided by the present application.

DETAILED DESCRIPTION OF THE EMBODIMENTS

In order to explain the objectives, technical solutions, and advantages of the present application more clearly, the technical solutions according to the present application will be clearly and completely described below in conjunction with the drawings in the present application. It should be noted that, the described embodiments are part of embodiments of the present application, rather than all of the embodiments. Based on the embodiments in the present application, all other embodiments obtained by those of ordinary skill in the art without creative work are within the scope of protection of the present application.

Figure 2:
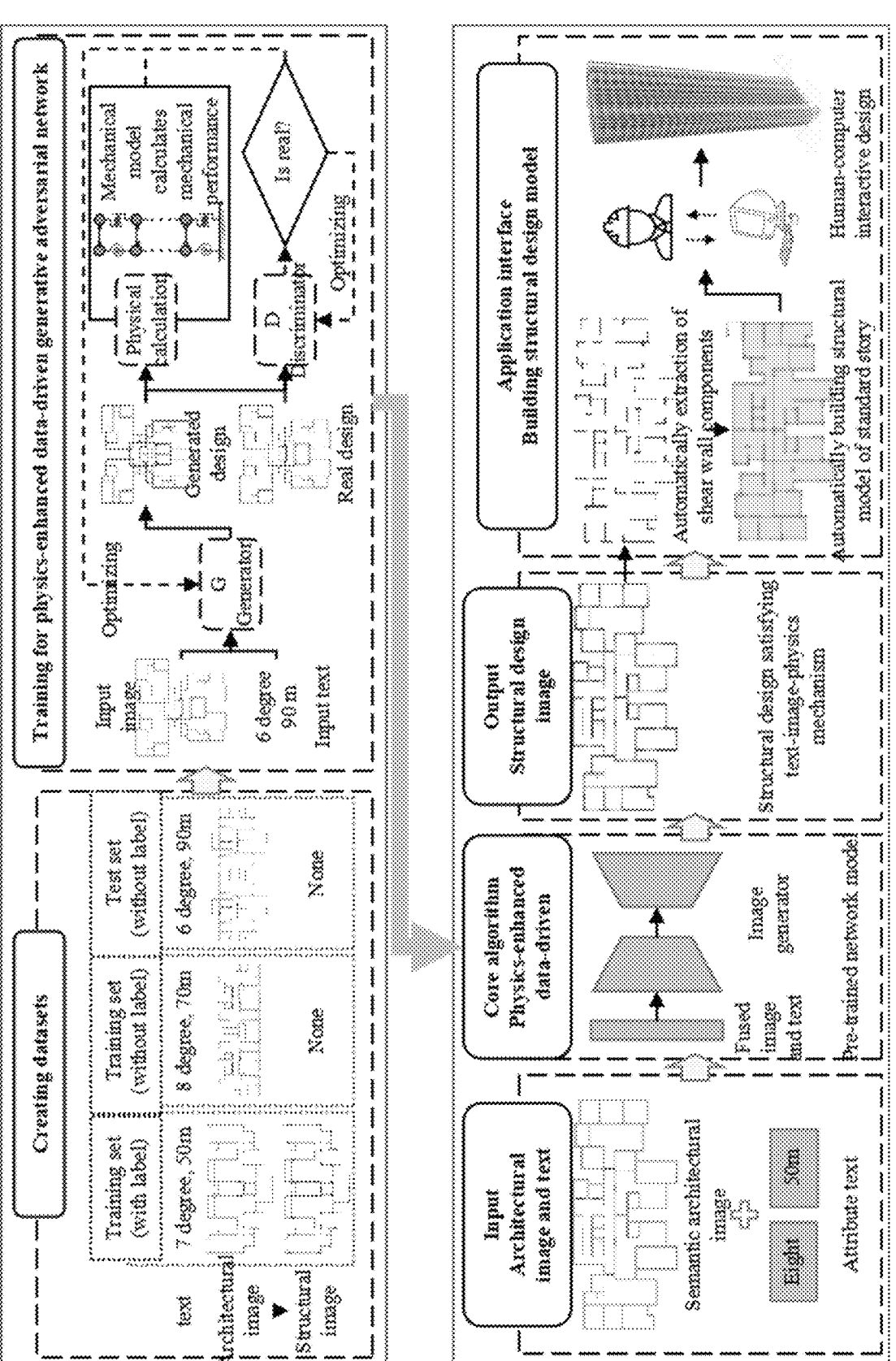
FIG. 2 is a schematic diagram of a physics-enhanced data-driven method for intelligent structural design of shear wall building provided by the present application.

FIGS. 1-2 show a physics-enhanced data-driven method for intelligent structural design of shear wall building provided by the present application. The method includes:

S110: obtaining an architectural design image and a basic design condition text to be processed;

S120: inputting the architectural design image and the basic design condition text into a structural design model, and obtaining a structural design image output by the structural design model; and the structural design model is obtained by performing a structural design image generation capability training and a physical performance optimization training for a physics-enhanced data-driven generative adversarial network, based on sample data of architectural design image, sample data of basic design condition text corresponding to the sample data of architectural design image and sample data of structural design image corresponding to the sample data of architectural design image; and S130: extracting vector data of shear wall components from the structural design image and vector data of building floor outline from the architectural design image; and obtaining a structural design result of a shear wall building based on the vector data of shear wall components and the vector data of building floor outline.

Figure 3:
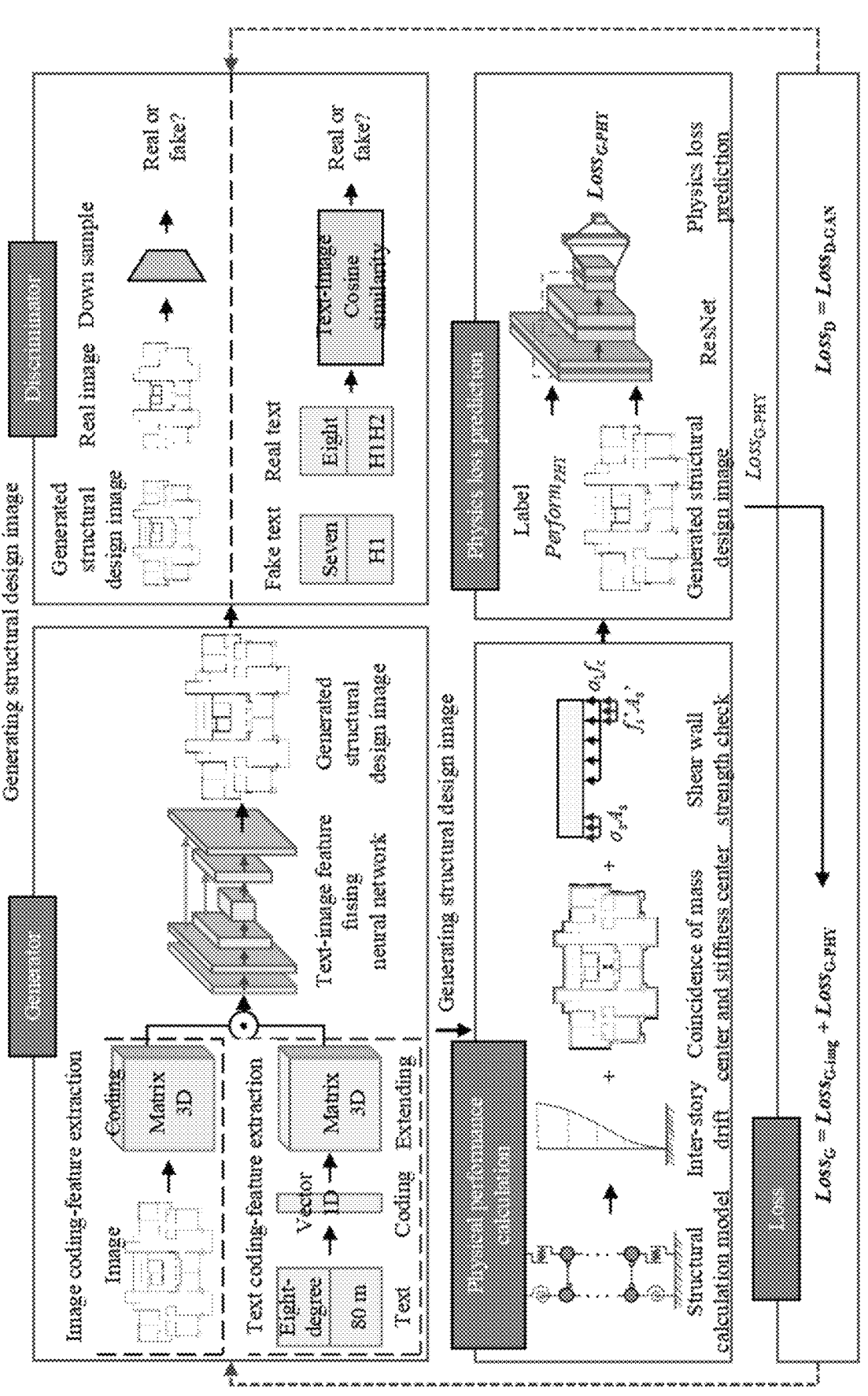
FIG. 3 is a schematic diagram of a training process for a structural design model.

Specifically, as shown in FIGS. 2-3, in this embodiment, a training process for the structural design model includes the following steps.

Step one: building the physics-enhanced data-driven generative adversarial network which is mainly composed of a generator and a discriminator. For example, the generator and the discriminator are conventional deep neural networks. The generator encodes image and text and extracts feature by convolutional neural networks, performs feature fusion by using Hadamard Product, and decodes feature by deconvolution neural networks, to generate the structural design image. And the discriminator performs feature extraction and authenticity discrimination for the structural design image generated by the generator by a convolutional neural network.

Step two: creating datasets for network training. For example, the datasets include structural design datasets with complete labels and structural design datasets without complete labels. For example, collecting sets of data of architectural design image, attribute text (i.e., basic design condition text), and the structural design image, to create structural design datasets with complete labels, i.e., sample data with complete labels; and create structural design datasets without complete labels, i.e., sample data without complete labels, for data with only architectural design image and basic design condition text.

Figure 4:
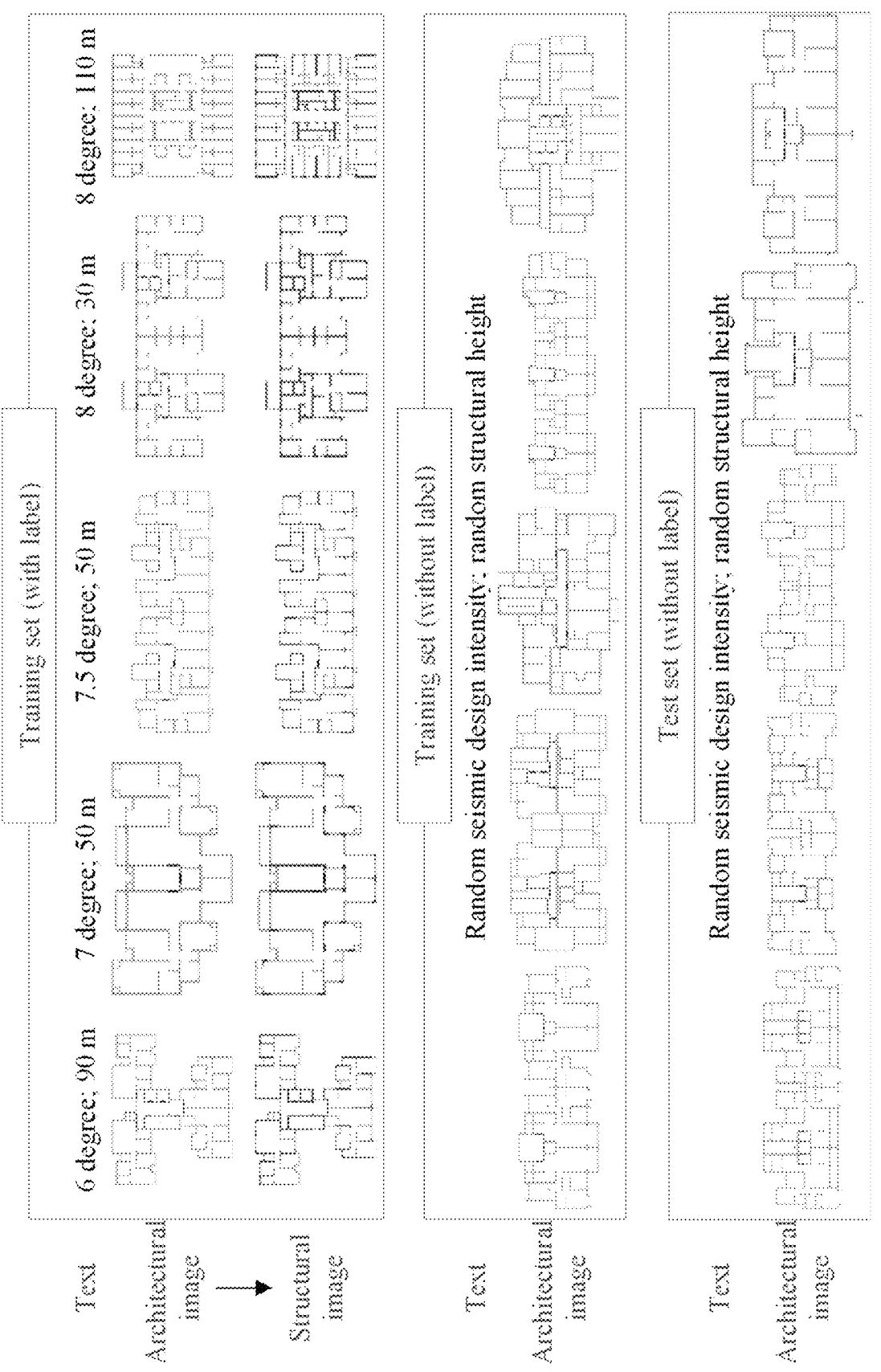
FIG. 4 is a diagram of typical datasets.

Typical datasets provided by this embodiment are exemplarily shown in FIG. 4. By obtaining the architectural design image, corresponding structural design image and basic design condition text, and pre-extracting critical elements of drawings and critical attributes of text according to prior knowledge of structural design, to complete datasets creation. Training set and testing set are obtained by random partition. The datasets include input label data and output target data.

Input label data include architectural design images and basic design condition texts. The label data are obtained by pre-screening and extracting features based on prior knowledge of structural design. As shown in FIG. 4, critical features in the architectural design image include layout positions of walls, windows, indoor doorways, and outdoor doorways. In order to distinguish each critical feature, different structural features can be represented by graphic elements having different colors. For example, gray graphic elements represent the layout positions of walls, green graphic elements represent windows, and indoor doorways, and blue graphic elements represent outdoor doorways. The basic design condition text includes seismic design intensity and building height. For example, the design of 6 degree represents that a seismic intensity is 6 degree, and 90 m represents that a structural height closes to 90 m. And other design conditions can be extrapolated accordingly.

The target data in this embodiment are structural design images. As shown in FIG. 4, the critical features in the structural design image include structural shear walls, structural columns, non-structural infill walls, windows, indoor doorways, and outdoor doorways. Each critical feature in the structural design image can be distinguished by graphic elements having different colors. For example, red graphic elements represent the layout positions of structural shear walls or structural columns, gray graphic elements represent the layout position of non-structural filling walls, green graphic elements represent windows and indoor doorways, and blue graphic elements represent outdoor doorways.

Step three: inputting sample data with complete labels into the physics-enhanced data-driven generative adversarial network, and performing a structural design image generation capability training for the physics-enhanced data-driven generative adversarial network, which can make the generative adversarial network have a basic generation capability of structural design image of shear wall building, and then can output corresponding structural design image.

Step four; performing a calculation of physical performance, for example, performing a calculation of physical performance for the structural design image generated in the process of the structural design image generation capability training, and obtaining a calculation result of physical performance. The calculation result of physical performance in this embodiment is a weighted sum of the calculation result of the distance between the mass center and the rigid center of the structure, the calculation result of the maximum structural drift, and the calculation result of the strength of structural components.

Specifically, a realization process of the calculation of physical performance includes the following.

Firstly, extracting a vector data of structural components of shear wall from the generated data of structural design image, and extracting a vector data of building floor outline from the sample data of architectural design image.

Figure 5:
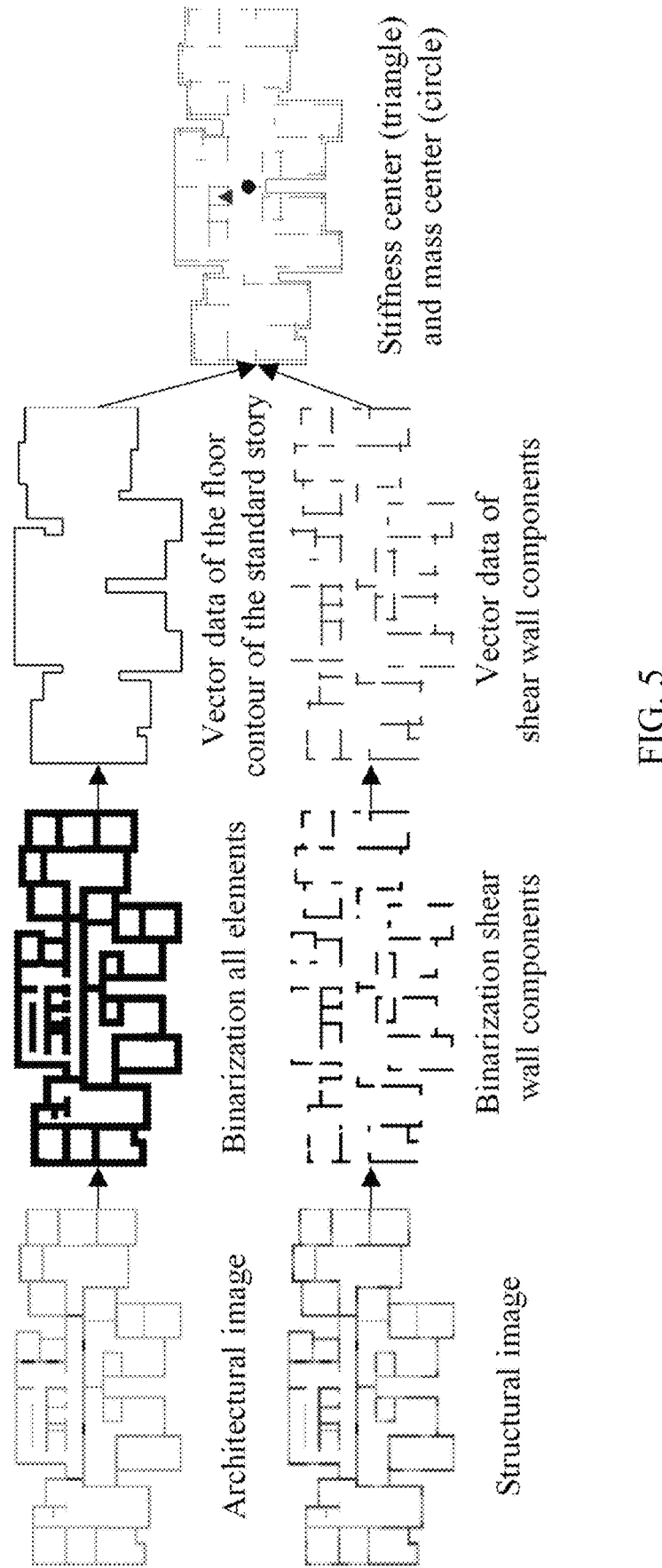
FIG. 5 is a realization schematic diagram of pixel drawing vectorization.

Since the structural design image and the architectural design image both are pixel drawings, the structural design image and the architectural design image need to be vectorized in the process of physical performance calculation. The vectorization process of the pixel drawing is shown in FIG. 5. In this embodiment, OpenCV-Python is used for image processing and vector extraction. For the architectural design image, converting all the elements by image binarization, expanding the elements by expansion operation to ensure closure of the building floor outline, and then extracting the building floor outline by contour detection, to obtain the coordinate information of the building floor outline, that is, the vector data of building floor outline.

For the structural design image, converting the shear wall elements by image binarization, removing the image noise by corrosion and expansion operation, and extracting the shear wall components by a method of intersecting grid lines with the shear wall elements, which can obtain the coordinate information of all the shear wall components, that is, the vector data of the structural components of the shear wall.

Then, based on the vector data of the shear wall structural components in the generated structural design image and the vector data of building floor outline in the sample data of architectural design image, calculating floor mass and floor stiffness, then creating a mass matrix and a stiffness matrix of shear wall building, and obtaining a multi-degree-of-freedom (MDOF) mechanics calculation model of shear wall building.

In this embodiment, typical shear wall residential structure is taken as a design object, and a multiple degree-of-freedom flexural-shear model can be used. The structure of the multiple degree-of-freedom flexural-shear model can be found in a structural mechanics calculation model, as shown in FIG. 3. A story mass matrix and a story stiffness matrix corresponding to the ith story of the multiple degree-of-freedom flexural-shear model are shown in the formulas (1) and (2).

$$
\begin{bmatrix}
M_i & & & \\
& 0 & & \\
& & M_{i-1} & \\
& & & 0
\end{bmatrix} \tag{1}
$$

-continued $$
\begin{bmatrix}
\dfrac{12EI_i}{h_i^3} + \dfrac{GA_i}{h_i} & -\dfrac{6EI_i}{h_i^2} & -\dfrac{12EI_i}{h_i^3} - \dfrac{GA_i}{h_i} & -\dfrac{6EI_i}{h_i^2} \\
-\dfrac{6EI_i}{h_i^2} & \dfrac{4EI_i}{h_i} & \dfrac{6EI_i}{h_i^2} & \dfrac{2EI_i}{h_i} \\
-\dfrac{12EI_i}{h_i^3} - \dfrac{GA_i}{h_i} & \dfrac{6EI_i}{h_i^2} & \dfrac{12EI_i}{h_i^3} + \dfrac{GA_i}{h_i} & \dfrac{6EI_i}{h_i^2} \\
-\dfrac{6EI_i}{h_i^2} & \dfrac{2EI_i}{h_i} & \dfrac{6EI_i}{h_i^2} & \dfrac{4EI_i}{h_i}
\end{bmatrix} \tag{2}
$$

A calculation method of story mass in the model is:

$$
M_i = \text{unit\_mass} \times A_i \tag{3}
$$

where, unit_mass is a mass of unit area, for example, unit_mass=14 kN/m², which can be obtained according to the experience of construction, such as an experience of construction in China, and $A_i$ is an area obtained by solving according to the building floor outline.

In the above formulas, $M_i$ is a mass of the ith story, $M_{i-1}$ is a mass of the (i-1)th story, $GA_i$ is a shear stiffness of the ith story, $EI_i$ is a flexural stiffness of the ith story, and $h_i$ is a height of the ith story.

Based on the in-plane action of the rigid floor diaphragm assumption, it can be approximately determined that the drifts of all shear wall components in the horizontal plane is coordinated, and the amplification effect of beam components in the floor system on the overall stiffness of the structure should also be considered. Based on that, the calculation formula of the flexural stiffness $EI_i$ of the ith story is:

$$
EI_i = \lambda_{EI} \sum EI_i^j \tag{4}
$$

where, $\lambda_{EI}$ is the amplification coefficient of flexural stiffness, which is related to the shear wall density and structural height, and $$
EI_i^j
$$

is the flexural stiffness of the jth shear wall in the ith story along its neutral axis.

It can be seen from formula (4) that the story flexural stiffness is equal to that the superposition of the flexural stiffness of all shear walls multiplies the amplification coefficient $\lambda_{EI}$ of the floor system on the flexural stiffness. Since the shear drift mechanism of the structure is more complex, the overall shear stiffness of the structure cannot be superimposed by the shear stiffness of all the shear walls. Therefore, in this embodiment, using a flexural-shear coupling coefficient $\alpha_{eq}$, and deducing the story shear stiffness $GA_i$ from the story flexural stiffness. The calculation formula is:

$$
GA_i = \left(\dfrac{\alpha_{eq}}{H}\right)^2 EI_i \tag{5}
$$

where, $\alpha_{eq}$ is a coupling ratio coefficient of structural flexural stiffness and shear stiffness, which is related to the density of the shear walls; and H is structural height.

Finally, according to the multi-degree-of-freedom mechanics calculation model, performing the structural mechanical response calculation and performance analysis of shear wall building, and obtaining the calculation result of physical performance.

In this embodiment, based on the multiple degree-of-freedom flexural-shear model and the physical mechanisms, the structural calculation and performance analysis are performed. Firstly, according to formula (6), the natural period and array type of the structure can be solved by the characteristic method, and the calculation formula is:

$$([K] - \omega^2[M])\{\phi\} = \{0\} \qquad (6)$$

where, [K] is a stiffness matrix, [M] is a mass matrix, $\omega$ is a natural frequency, and $\{\phi\}$ is a vector of mode shape.

Based on the structural dynamic characteristics, structural design information, and seismic design code for building structures, such as GB 50011-2010 in China, the corresponding seismic design intensity can be calculated and obtained. Then, based on the response spectrum method, calculating the seismic force in different directions and the overall drift response of the structure. Wherein, the most important performance for structural design is the overall inter-story drift ratio of the structure. Specifically, the calculation formulas of seismic force and overall structural drift response are:

$$F_{ij} = \alpha_j \gamma_j X_{ji} G_i \qquad (7)$$

$$\gamma_j = \sum_{i=1}^{n} X_{ji} G_i \bigg/ \sum_{i=1}^{n} X_{ji}^2 G_i \qquad (8)$$

where, $F_{ji}$ is a standard value of horizontal seismic action of jth-mode ith-mass source, $\alpha_j$ is a seismic influence coefficient corresponding to the natural period of jth-mode, $X_{ji}$ is a horizontal relative displacement of jth-mode ith-mass source, $\gamma_j$ is a modal mass participation coefficient of jth-mode, and $G_i$ is the equivalent gravity load of the ith-mass source.

Then, allocating the seismic force of the structure according to the stiffness ratio of shear wall components and checking the strength performance of each shear wall component according to the force of each shear wall component. Checking the strength of shear wall components includes checking the axial load, shear strength, and flexural strength.

Based on the vector data of the structural plane design obtained in FIG. 5, the distribution and distance $D_{cs\_cm}$ of the mass center and the rigid center of the structural design are obtained. Performing the mechanical response calculation and performance analysis of the structure based on the multiple degree-of-freedom flexural-shear model, then can obtain the maximum inter-story drift $drift_{max}$ of the structure and the checking calculation result of the strength of the shear wall structure.

According to the above-obtained data, calculating the comprehensive physical performance of the training process for the structural design image generation capability, weighting and summing the distance between the mass center and the rigid center of the structure, the maximum inter-story drift of the structure, and the checking calculation result of the strength of the structural components, and obtaining the comprehensive physical performance, that is, the calculation result of physical performance. The calculation formula of comprehensive physical performance (Perform$_{PHY}$) is:

$$\text{Perform}_{PHY} = \omega_t \text{perform}_{torsion} + \omega_d \text{perform}_{drift} + \omega_s \text{perform}_{strength} \qquad (9)$$

where, $\omega_t$, $\omega_d$, and $\omega_s$ are the weight coefficients of torsional performance, inter-story drift performance, and component strength performance, respectively.

In this embodiment, the comprehensive physical performance is composed of three main indexes: torsional performance (perform$_{torsion}$), inter-story drift performance (perform$_{drift}$), and component strength performance (perform$_{strength}$).

For example, the calculation formula of the distance between the mass center and the rigid center of the structure is:

$$D_{cs\_cm} = \sqrt{(x_{cs} - x_{cm})^2 + (y_{cs} - y_{cm})^2}, \qquad (10)$$

where:

$$(x_{cs}, y_{cs}) = \left( \frac{\sum k_y x}{\sum k_y}, \frac{\sum k_x y}{\sum k_x} \right), \qquad (11)$$

the expression of torsional performance (perform$_{torsion}$) is:

$$\text{perform}_{torsion} = D_{cs\_cm} / D_{limit}. \qquad (12)$$

It can be seen that the larger the distance is, the more prone the structure to torsional drift is. $D_{limit}$ is used to normalize $D_{cs\_cm}$ to ensure that the perform$_{torsion}$ value is in [0,1].

The calculation formula of the inter-story drift performance (perform$_{drift}$) of the structure is:

$$\text{perform}_{drift} = \begin{cases} \dfrac{drift_{limit} - drift_{max}}{drift_{limit}}, & drift_{max} < drift_{limit} \\ \left( \dfrac{drift_{max} - drift_{limit}}{drift_{limit}} \right)^{0.5}, & drift_{max} > drift_{limit} \end{cases} \qquad (13)$$

When the maximum inter-story drift ($drift_{max}$) of the structure is less than the $drift_{limit}$ specified in the code, perform$_{drift}$ changes linearly. When the maximum inter-story drift ($drift_{max}$) of the structure is greater than the $drift_{limit}$ specified in the code, perform$_{drift}$ changes with a formula of 0.5 power, which indicates that when perform$_{drift}$ is greater than the $drift_{limit}$ specified in the code, the loss increases faster, and the perform$_{drift}$ value is in [0, 1].

The calculation formula of strength performance (perform$_{strength}$) of the shear wall components is:

$$\text{perform}_{strength} = \frac{1}{N} \sum_{i=1}^{N} p_i^{strength} \qquad (14)$$

where, N is the total number of shear walls, and $$p_i^{strenght}$$

is the strength performance of each shear wall.

Performing checking calculation for the strength of each shear wall component, when the result of the checking calculation is passing, $$p_i^{strenght}$$

is 0, and when it's not passing, $$p_i^{strenght}$$

is 1. Finally, averaging the results of the checking calculation of all shear walls, and perform$_{strength}$ value is also in [0,1].

Step five: calculating the physics loss. Firstly, based on the structural design image generated by the generator and the physical performance obtained by physical calculation, a large number of datasets of structural design image-physical performance calculation results can be created. Then, based on residual networks, building a neural network model for predicting structural mechanics performance, that is, a structural physical performance prediction neural network. And then, performing training for the built structural physical performance prediction neural network based on the datasets. After completing a large number of training data, the structural physical performance prediction neural network can accurately predict the comprehensive physical performance, that is, the physical performance prediction result, corresponding to the structural design image. Therefore, a trained structural physical performance prediction model is obtained. Finally, by inputting the sample data of the structural design image into the structural physical performance prediction model, the corresponding comprehensive physical performance can be predicted and obtained. And the obtained comprehensive physical performance is used as the physics loss ($Loss_{G-PHY}$) in the subsequent training of the generative adversarial network.

In this embodiment, the loss of the generator includes image data loss and physical performance loss. The image data loss is obtained by calculating the losses of the image analysis results of the generator and the discriminator, and the physical loss of the generator is obtained by a calculation of the structural physical performance prediction model.

Finally, after fusing the image data loss and the physical performance loss, the loss of the generator is described as follows:

$$Loss_G = \omega_{img}Loss_{G-img} + \omega_{PHY}Loss_{G-PHY} \qquad (15)$$

where, $\omega_{img}$ is a weight of image data loss, $Loss_{G-img}$ is the image data loss, $\omega_{PHY}$ is a weight of physical performance loss, and $Loss_{G-PHY}$ is the physical performance loss.

The expression of the loss inputted into the discriminator is:

$$Loss_D = Loss_{D-GAN} \qquad (16)$$

where, $L_{OSSD-GAN}$ is the discriminant loss of the generative adversarial network.

Step six; performing an optimization training for the physics-enhanced data-driven generative adversarial network after the structural design image generation capability training through the loss function, and obtaining the structural design model.

In this embodiment, a physical calculation loss is used to optimize the learning of structural design experience of the neural network model, to overcome the constraint of only-data supported network model training. Based on data with labels and data without complete labels, using the semi-supervised learning algorithm, the training for the physics-enhanced data-driven network model can be effectively realized. In the early stage of the training, there is a need to rely on the data with labels for network training, which makes the neural network capable of generating structural design images. Subsequently, using the physical mechanism to optimize the training of the network model, which makes the neural network gradually have a structural design capability; and performing the semi-supervised learning with the data without a complete label to improve the structural design capability of the network.

Figure 6:
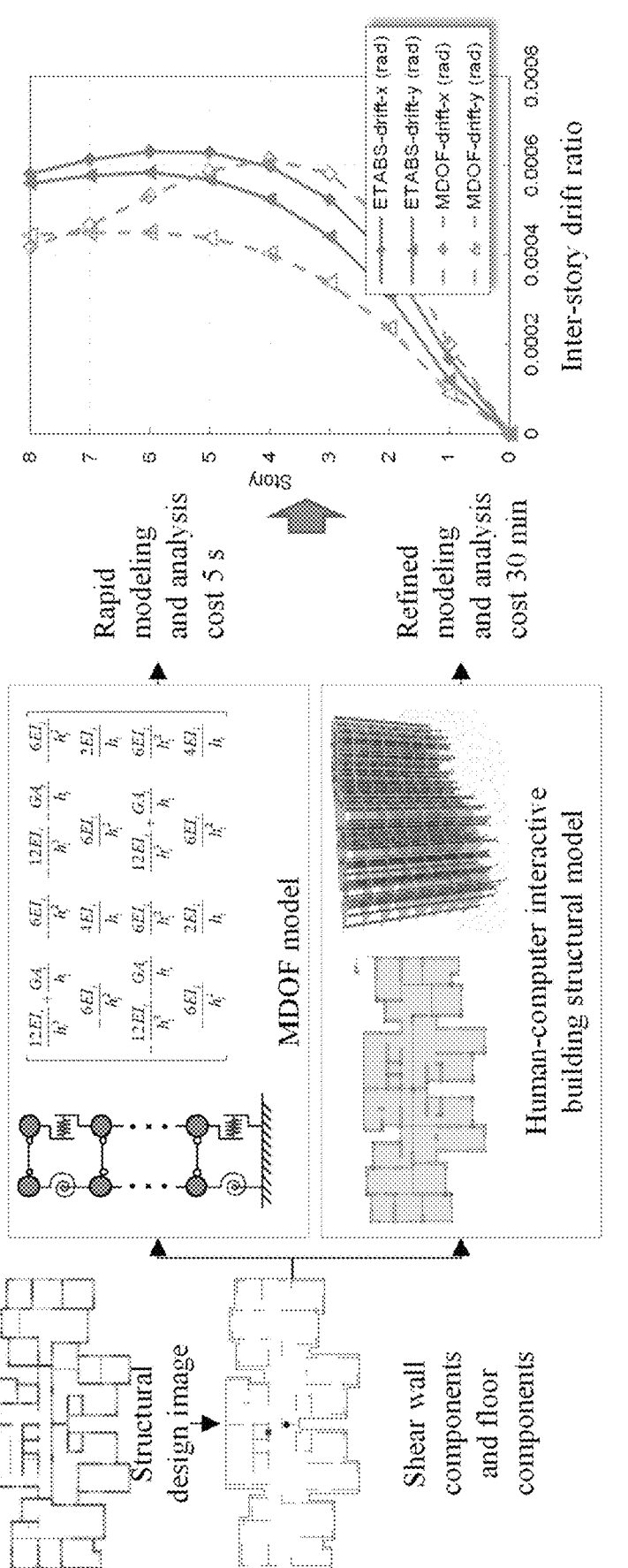
FIG. 6 is a realization schematic diagram of vectorizing a structural design image to obtain a structural mechanics model.

In this embodiment, the structural design model can be obtained by performing semi-supervised training for the physics-enhanced data-driven generative adversarial network, and the corresponding structural design image can be output by inputting the architectural design image and the basic design condition text into the structural design model. As shown in FIG. 6, since the structural design image is a pixel drawing and cannot be directly applied to the actual building structural modeling and design, there is a need to vectorize the structural design image. And using the obtained vector data, the structural mechanics model of the shear wall building can be built and obtained, and the modeling and calculation of the overall shear wall structure with human-computer interaction can be realized to obtain the structural design result. According to the requirements of the seismic design code, such as a seismic design code in China, the maximum inter-story drift ratio should be less than 1/1000. From the data of the inter-story drift ratio in FIG. 6, it can be seen that the corresponding mechanical response of the structural design result obtained by the present application shown in FIG. 6 meets the requirements of the seismic design code.

It should be noted that although the vectorization of the architectural design image and the structural design image and the building of structural calculation mechanics model is needed in the training process of the structural design model and the process of obtaining structural design results in practical application, and the realization principles of vectorization processing and building structural calculation mechanics model are roughly the same, the process of building the multi-degree-of-freedom mechanics calculation model in the training stage of structural design model is a process of rapid modeling, which takes about 5 seconds for analysis and calculation, and in the process of obtaining the structural design result, the process of building the structural mechanical model for human-computer interaction is a process of refined modeling, which takes about 30 minutes for analysis and calculation.

The following is a description of the physics-enhanced data-driven device for intelligent structural design of shear wall building provided by the present application. The physics-enhanced data-driven device for intelligent structural design of shear wall building is described below; and the physics-enhanced data-driven method for intelligent structural design of shear wall building described above can be referred to each other.

An embodiment of the present application provides a physics-enhanced data-driven device for intelligent structural design of shear wall building. The device includes a memory, a processor, and a computer program stored in the memory and executable by the processor, wherein, when the program is executed by the processor, it causes the processor to:

obtain an architectural design image and a basic design condition text to be processed;

input the architectural design image and the basic design condition text into a structural design model, and obtain a structural design image output by the structural design model; wherein, the structural design model is obtained by performing a structural design image generation capability training and a physical performance optimization training for a physics-enhanced data-driven generative adversarial network, based on sample data of architectural design image, sample data of basic design condition text corresponding to the sample data of architectural design image and sample data of structural design image corresponding to the sample data of architectural design image; and extract vector data of shear wall components from the structural design image and vector data of building floor outline from the architectural design image, and obtain a structural design result of shear wall building based on the vector data of shear wall components and the vector data of building floor outline.

Figure 7:
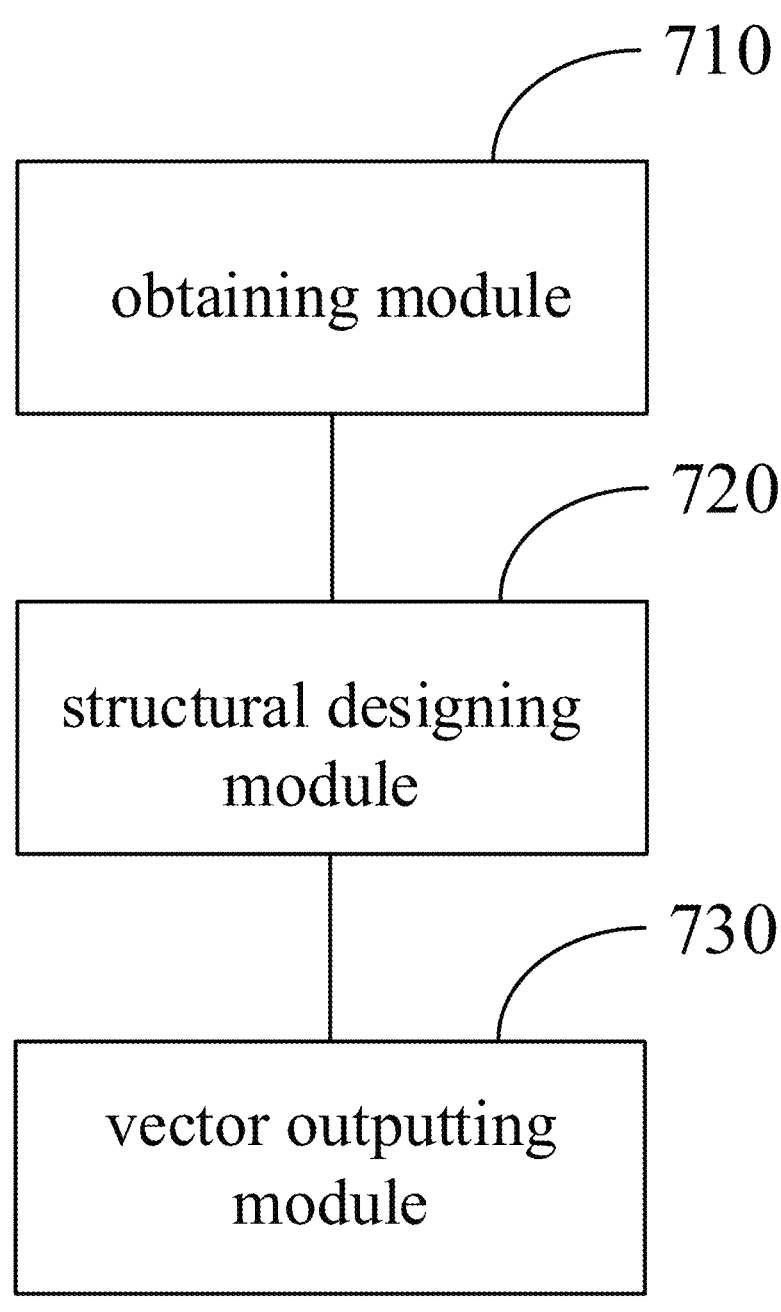
FIG. 7 is a structural diagram of a physics-enhanced data-driven device for intelligent structural design of shear wall building provided by the present application.

As shown in FIG. 7, a physics-enhanced data-driven device for intelligent structural design of shear wall building provided by the embodiments of the present application, including:

an obtaining module 710, which is configured to obtain an architectural design image and a basic design condition text to be processed;

a structure designing module 720, which is configured to input the architectural design image and the basic design condition text into a structural design model, and obtain a structural design image output by the structural design model; wherein, the structural design model is obtained by performing a structural design image generation capability training and a physical performance optimization training for a physics-enhanced data-driven generative adversarial network, based on sample data of architectural design image, sample data of basic design condition text corresponding to the sample data of architectural design image and sample data of structural design image corresponding to the sample data of architectural design image; and a vector outputting module 730, which is configured to extract vector data of shear wall components from the structural design image and vector data of building floor outline from the architectural design image; and obtain a structural design result of a shear wall building, based on the vector data of shear wall components and the vector data of building floor outline.

In this embodiment, the structure designing module 720 generates a structural design image of the target shear wall building through a pre-trained structural design model. Specifically, the training process for the structural design model is as follows:

firstly, creating structural design datasets with complete labels and without complete labels; and creating training datasets with complete labels, supported by complete sets for architectural design image, basic design condition text, and structural design image; and creating training datasets without complete labels, for data only with architectural design image and basic design condition text;

then, performing training for the neural network model based on the created datasets and a pre-built physics-enhanced data-driven generative adversarial network; at first, performing training for the neural network by the sample data with complete labels, to make the neural network have the capability of generating shear wall structural design image; and then, calculating the physical mechanism, optimizing the network training by combining with data training, and performing a hybrid semi-supervised training by using the sample data with complete labels and the sample data without complete labels, to improve the structural design capability of the generative adversarial network and obtain the structural design model; and after obtaining the trained structural design model, inputting the building design image and the corresponding basic design condition text, then the structural design image that meets the design requirements can be output: however, since the obtained structural design image is a pixel drawing, it cannot be directly applied to the human-computer interaction modeling: therefore, in the embodiments of the present application, a vectorization is performed for the structural design image and the architectural design image by the vector outputting module 730, and the vector data of building floor outline and the shear wall structural components are extracted. Based on the application program interface of the structural design software, performing the human-computer interaction structural design, to obtain the structural mechanics model of the shear wall building, that is, a three-dimensional structural model, and realizing the intelligent generative design of the shear wall building structure.

In order to realize the above embodiments, the embodiments of the present application provide an electronic equipment, comprising a memory, a processor, and a computer program stored in the memory and executable by the processor, where, when the program is executed by the processor, steps of the physics-enhanced data-driven method for intelligent structural design of shear wall building as described in the above embodiments executed by the terminal equipment are performed.

In order to realize the above embodiments, the embodiments of the present application provide a non-transient computer-readable storage medium having a computer program stored therein, where, when the program is executed by the processor, it causes the processor to implement the steps of the physics-enhanced data-driven method for intelligent structural design of shear wall building as described in the above method embodiments.

Finally, it should be noted that the above-mentioned embodiments are only used to explain the technical solutions of the present application, and are not limited thereto; although the present application has been described in detail with reference to the foregoing embodiments, it should be understood by those skilled in the art that they can still modify the technical solutions documented in the foregoing embodiments and make equivalent substitutions to a part of the technical features; these modifications and substitutions do not make the essence of the corresponding technical solutions depart from the spirit and scope of the technical solutions of various embodiments of the present application.

What is claimed is:

1. A physics-enhanced data-driven method for intelligent structural design of a shear wall building that meets requirements, comprising:

obtaining an architectural design image and a basic design condition text to be processed;

inputting the architectural design image and the basic design condition text into a structural design model, and obtaining a structural design image output by the structural design model; wherein, the structural design model is obtained by performing a structural design image generation capability training and a physical performance optimization training for a physics-enhanced data-driven generative adversarial network, based on sample data of architectural design image, sample data of basic design condition text corresponding to the sample data of architectural design image and sample data of structural design image corresponding to the sample data of architectural design image;

and extracting vector data of shear wall components from the structural design image and vector data of building floor outline from the architectural design image, and then obtaining a structural design result of the shear wall building based on the vector data of the shear wall components and the vector data of building floor outline to check strength of shear wall components.

2. The physics-enhanced data-driven method for intelligent structural design of the shear wall building according to claim 1, wherein, a training process for the structural design model comprises:

building the physics-enhanced data-driven generative adversarial network;

inputting sample data with complete labels into the physics-enhanced data-driven generative adversarial network, and performing the structural design image generation capability training for the physics-enhanced data-driven generative adversarial network; wherein, the sample data with complete labels comprises sample data of architectural design image, sample data of basic design condition text corresponding to the sample data of architectural design image and sample data of structural design image corresponding to the sample data of architectural design image;

performing a calculation of physical performance for the structural design image generated during a process of the structural design image generation capability training, and obtaining a calculation result of physical performance;

building a structural physical performance prediction neural network, and performing a structural physical performance prediction capability training for the structural physical performance prediction neural network with training data of the structural design image generated during the process of structural design image generation capability training and the calculation result of physical performance, and obtaining a structural physical performance prediction model;

calculating image data loss during the process of structural design image generation capability training, calculating corresponding physics loss by the structural physical performance prediction model, fusing the image data loss and the physics loss, to obtain a loss function of the physics-enhanced data-driven generative adversarial network; and performing, based on the loss function, an optimization training for the physics-enhanced data-driven generative adversarial network after the structural design image generation capability training, and obtaining the structural design model.

3. The physics-enhanced data-driven method for intelligent structural design of the shear wall building according to claim 2, wherein, the physics-enhanced data-driven generative adversarial network comprises:

an image generator, which is configured to perform encoding and feature extraction for the sample data of architectural design image and the sample data of basic design condition text, respectively, to obtain an image feature and a text feature, fuse the image feature and the text feature and decode a feature fused by the image feature and the text feature, and generate the structural design image; and an image discriminator, which is configured to perform feature extraction and authenticity discrimination for the generated structural design image.

4. The physics-enhanced data-driven method for intelligent structural design of the shear wall building according to claim 2, wherein, the performing the calculation of physical performance for the structural design image generated during the process of the structural design image generation capability training, and obtaining the calculation result of physical performance, comprises:

extracting the vector data of the shear wall components from the generated structural design image and the vector data of building floor outline from the sample data of architectural design image;

calculating, based on the vector data of shear wall components from the generated structural design image and the vector data of the floor outline from the sample data of architectural design image, floor mass and floor stiffness, creating a mass matrix and a stiffness matrix of the shear wall building, and obtaining a multi-degree-of-freedom mechanics calculation model of the shear wall building; and performing, based on the multi-degree-of-freedom mechanics calculation model, a calculation of structural mechanical response and a performance analysis for the shear wall building, and obtaining the calculation result of physical performance.

5. The physics-enhanced data-driven method for intelligent structural design of the shear wall building according to claim 2, wherein, a process of building, training, and prediction of the structural physical performance prediction model comprises:

building, based on a residual network structure, a structural physical performance prediction neural network configured for image feature extraction and physical performance prediction;

performing a physical performance prediction capability training for the structural physical performance prediction neural network based on the structural design image generated during the process of the structural design image generation capability training and a corresponding calculation result of physical performance, and obtaining a structural physical performance prediction model; and performing, by the structural physical performance prediction model, a physical performance prediction for the structural design image generated during the process of the structural design image generation capability training, to obtain a corresponding physics loss.

6. The physics-enhanced data-driven method for intelligent structural design of the shear wall building according to claim 2, wherein, after performing, based on the loss function, the optimization training for the physics-enhanced data-driven generative adversarial network after the structural design image generation capability training, the method further comprises:

performing a semi-supervised optimization training for the physics-enhanced data-driven generative adversarial network, based on sample data without complete labels and sample data with complete labels; wherein, the sample data without complete labels comprises the sample data of architectural design image and the sample data of basic design condition text.

7. A non-transient computer-readable storage medium, having a computer program stored therein, wherein, when the program is executed by a processor, it causes the processor to implement the steps of the physics-enhanced data-driven method for intelligent structural design of the shear wall building according to claim 1.

8. A physics-enhanced data-driven device for intelligent structural design of a shear wall building that meets requirements, comprising a memory, a processor, and a computer program stored in the memory and executable by the processor, wherein, when the program is executed by the processor, causes the processor to:

obtain an architectural design image and a basic design condition text to be processed;

input the architectural design image and the basic design condition text into a structural design model, and obtain a structural design image output by the structural design model; wherein, the structural design model is obtained by performing a structural design image generation capability training and a physical performance optimization training for a physics-enhanced data-driven generative adversarial network, based on sample data of architectural design image, sample data of basic design condition text corresponding to the sample data of architectural design image and sample data of structural design image corresponding to the sample data of architectural design image; and extract vector data of shear wall components from the structural design image and vector data of building floor outline from the architectural design image, and obtain a structural design result of the shear wall building based on the vector data of the shear wall components and the vector data of building floor outline to check strength of shear wall components.

* * * * *